(12) United States Patent
Chuang et al.

(10) Patent No.: US 11,489,085 B1
(45) Date of Patent: Nov. 1, 2022

(54) LIGHT SENSING DEVICE HAVING OFFSET GATE ELECTRODE AND LIGHT SENSING PANEL USING THE SAME

(71) Applicant: HANNSTOUCH SOLUTION INCORPORATED, Tainan (TW)

(72) Inventors: Che-Yu Chuang, Tainan (TW); Ching-Feng Tsai, Tainan (TW)

(73) Assignee: HANNSTOUCH SOLUTION INCORPORATED, Tainan (TW)

( * ) Notice: Subject to any disclaimer, the term of this patent is extended or adjusted under 35 U.S.C. 154(b) by 0 days.

(21) Appl. No.: 17/384,814

(22) Filed: Jul. 26, 2021

(51) Int. Cl.
*H01L 31/062* (2012.01)
*H01L 31/113* (2006.01)
*H01L 31/0224* (2006.01)

(52) U.S. Cl.
CPC .. *H01L 31/1136* (2013.01); *H01L 31/022416* (2013.01)

(58) Field of Classification Search
CPC ........... H01L 31/1136; H01L 31/02165; H01L 31/022416
USPC ........................................................ 257/290
See application file for complete search history.

(56) References Cited

U.S. PATENT DOCUMENTS 8,247,816 B2 * 8/2012 Jun .......................... H01L 27/12
257/292
2013/0234219 A1 * 9/2013 Yamada ............ H01L 27/14623
257/365

* cited by examiner

*Primary Examiner* — Calvin Y Choi
(74) *Attorney, Agent, or Firm* — CKC & Partners Co., LLC

(57) ABSTRACT

A light sensing device includes a substrate, a gate electrode, a shielding electrode, a insulating layer, a semiconductor layer, a source electrode, and a drain electrode. The gate electrode and the shielding electrode are disposed over the substrate and spaced apart from each other. The insulating layer is disposed over the gate electrode and the shielding electrode. The semiconductor layer is disposed over the insulating layer. The source and drain electrodes are respectively connected to the semiconductor layer, and the semiconductor layer has a channel region between the source and drain electrodes. The channel region is divided into a first region adjacent to the drain electrode and overlapping the gate electrode and a second region adjacent to the source electrode and not overlapping the gate electrode, and the second region partially overlaps the shielding electrode.

12 Claims, 17 Drawing Sheets

LIGHT SENSING DEVICE HAVING OFFSET GATE ELECTRODE AND LIGHT SENSING PANEL USING THE SAME

BACKGROUND

Field of Invention

The present invention relates to light sensing devices and light sensing panels using the same.

Description of Related Art

Photoelectric sensors can convert light into current or voltage signals. The photoelectric sensors can be manufactured in the form of thin film transistors and arranged in an array, which is then used in the fields of optical touch, fingerprint recognition, X-ray detection, etc. The photoelectric sensor may include a semiconductor thin film having a suitable band gap corresponding to the wavelength of light to be absorbed.

SUMMARY

According to some embodiments of the present disclosure, a light sensing device includes a substrate, a gate electrode, an insulating layer, a semiconductor layer, a first drain/source electrode, and a second source/drain electrode. The gate electrode is over the substrate. The shielding electrode is over the substrate and spaced apart from the gate electrode. The insulating layer is over the gate electrode and the shielding electrode, wherein the gate electrode and the shielding electrode has a gap therebetween. The semiconductor layer is over the insulating layer. The first drain/source electrode and the second source/drain electrode are respectively connected to the semiconductor layer. The semiconductor layer has a channel region between the first drain/source electrode and the second source/drain electrode, the channel region is divided into a first region and a second region, the first region is adjacent to the first drain/source electrode and overlapping the gate electrode, the second region is adjacent to the second source/drain electrode and not overlapping the gate electrode, and the second region partially overlaps the shielding electrode.

According to some embodiments of the present disclosure, a light sensing panel includes the aforementioned light sensing device, a scan line, a bias line, a sensing switch device, and a low potential line. The scan line is over the substrate. The bias line is over the substrate. The sensing switch device is over the substrate, in which a control terminal of the sensing switch device is electrically connected to the scan line, and two terminals of the sensing switch device are respectively connected to the bias line and the first drain/source electrode of the light sensing device. The low potential line is over the substrate and electrically connected to the second source/drain electrode of the light sensing device.

According to some embodiments of the present disclosure, a light sensing panel includes the aforementioned light sensing device, a scan line, and a low potential line. The scan line is over the substrate, in which the gate electrode of the light sensing device is electrically connected to the scan line, and the first drain/source electrode of the light sensing device is electrically connected to the scan line. The low potential line is over the substrate, in which the second source/drain electrode of the light sensing device is electrically connected to the low potential line.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following invention provides many different embodiments, or examples, for implementing different features of the provided subject matter. Specific examples of components and arrangements are described below to simplify the present invention. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1A:
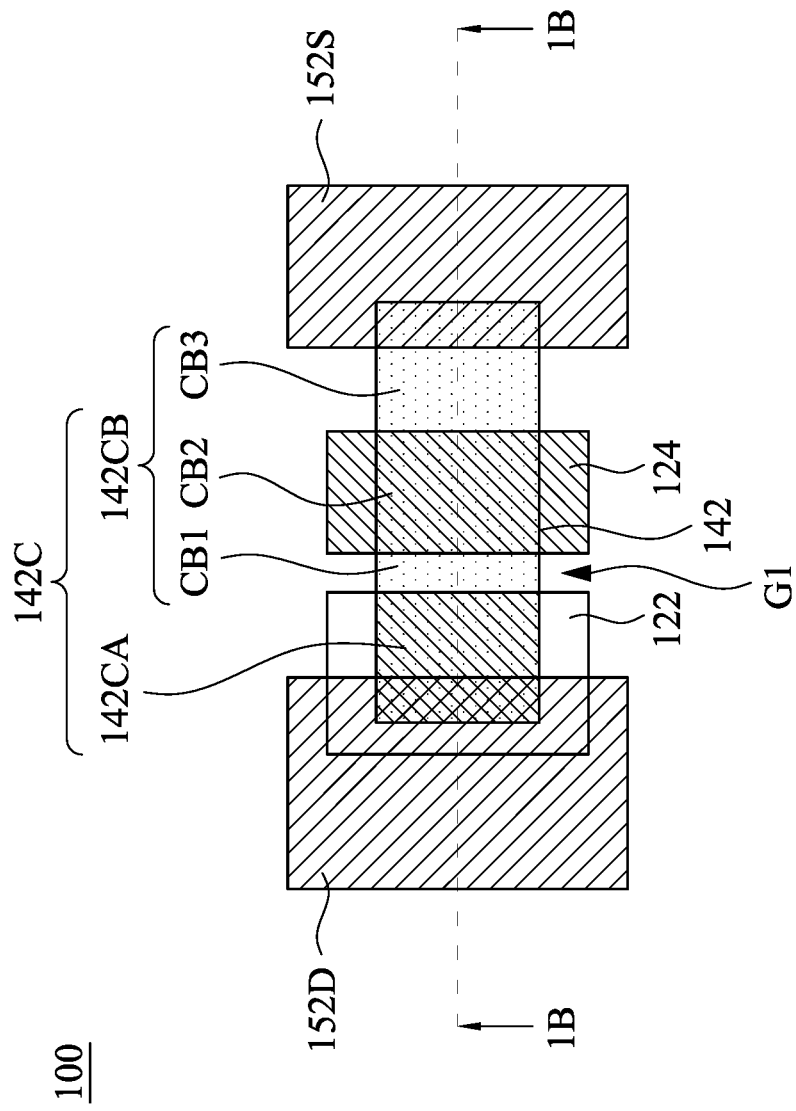
FIG. 1A is a schematic top view of a light sensing device according to some embodiments of the present invention.
Figure 1B:
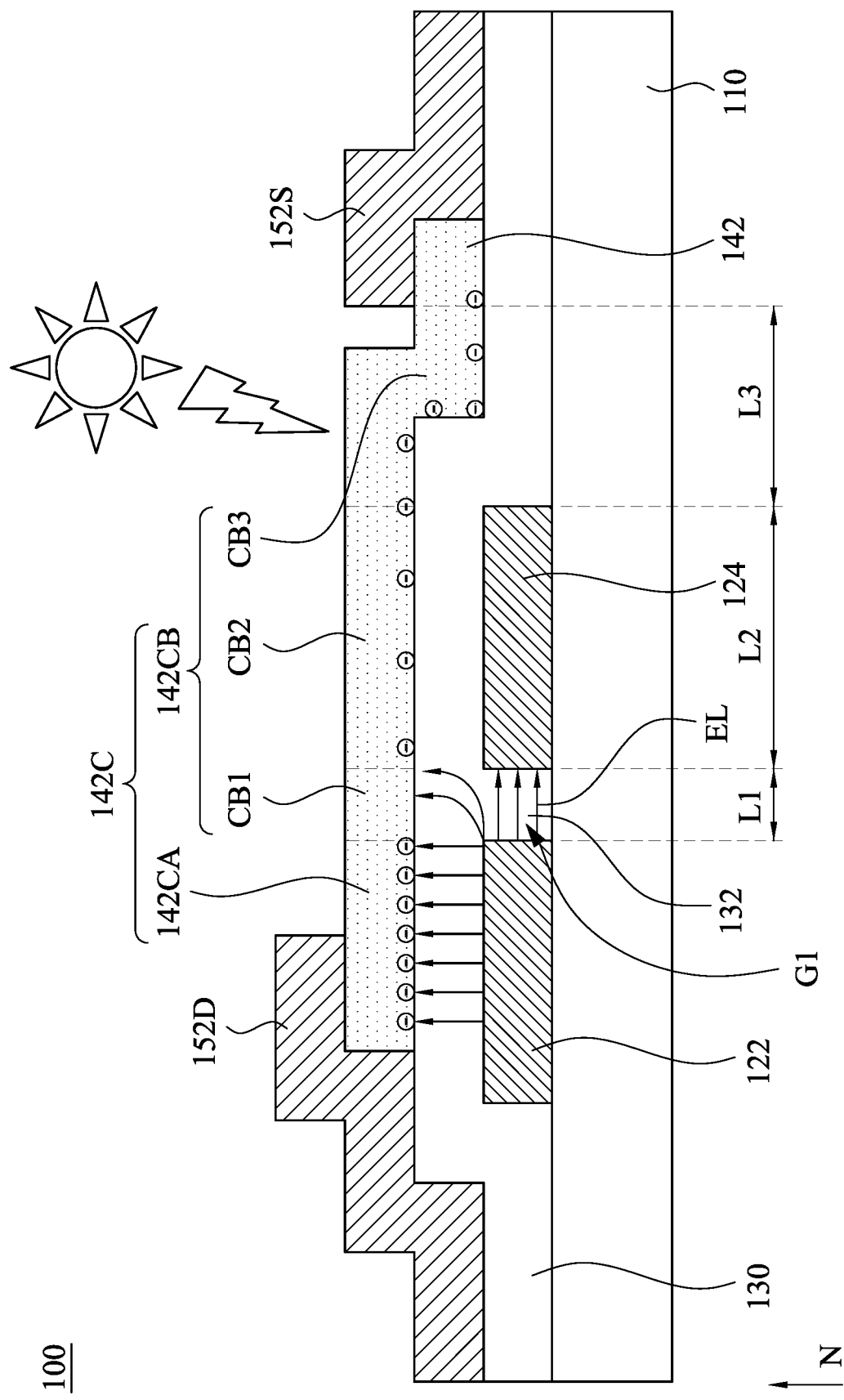
FIG. 1B is a schematic cross-sectional view taken along line 1B-1B of FIG. 1A.

FIG. 1A is a schematic top view of a light sensing device 100 according to some embodiments of the present invention. FIG. 1B is a schematic cross-sectional view taken along line 1B-1B of FIG. 1A. The light sensing device 100 includes a substrate 110, a gate electrode 122, a shielding electrode 124, an insulating layer 130, a semiconductor layer 142, a source/drain electrode 152S, and a drain/source electrode 152D. The gate electrode 122 and the shielding electrode 124 are over the substrate 110, and spaced apart from each other. The insulating layer 130 is over the gate electrode 122 and the shielding electrode 124. The semiconductor layer 142 is over the insulating layer 130. The source/drain electrode 152S and the drain/source electrode 152D are respectively connected to the semiconductor layer 142.

In some embodiments, the semiconductor layer 142 has a channel region 142C between the source/drain electrodes 152S and 152D. In some embodiments, the gate electrode 122 is offset disposed. In other words, the light sensing device 100 may be, for example, a deviated-gate type thin film transistor. To be specific, a center of the gate electrode 122 overlapping the channel region 142C is deviated from a middle point of the channel region 142C between the source/drain electrodes 152S and 152D. In the present embodiments, the gate electrode 122 is not disposed at the middle point of the channel region 142C between the source/drain electrodes 152S and 152D and is offset to one of the source/drain electrodes 152S and 152D, such that the channel region 142C is divided into a switch region 142CA and a photosensitive region 142CB, in which the switch region 142CA overlaps the gate electrode 122 along a direction N normal to a top surface of the substrate 110, and the photosensitive region 142CB does not overlap the gate electrode 122 along the direction N. In some embodiments, a boundary between the switch region 142CA and the photosensitive region 142CB is aligned with an edge of the gate electrode 122. Through the configuration, an electrical path of the entire channel region 142C of the semiconductor layer 142 (i.e., a combination of the switch region 142CA and the photosensitive region 142CB) is controlled by the light, and therefore is capable of sensing the light, in which the electrical path of the switch region 142CA of the semiconductor layer 142 can be further controlled by the gate electrode 122.

Through the configuration, when the light sensing device 100 operates, a suitable voltage is applied onto the gate electrode 122, the switch region 142CA and the photosensitive region 142CB of the semiconductor layer 142 senses light and generate currents, and by detected the value of the current, a light intensity can be calculated. In an embodiment, a positive voltage is applied onto the gate electrode 112 to turn on the switch region 142CA, and the semiconductor layer 142 may sense light and generate current. Herein, the value of the current is mainly controlled by the photosensitive region 142CB. In another embodiments, a negative voltage is applied onto the gate electrode 112 to inhibit the switch region 142CA, and the semiconductor layer 142 may sense light and generate current. Herein, the value of the current is mainly controlled by the switch region 142CA and the photosensitive region 142CB. In the embodiment where a negative voltage is applied onto the gate electrode 112, the current is influenced by the light intensity more obviously, such that the light sensing device 100 has a higher resolution to the light intensity. The light sensing device 100 of the present embodiments, which has an advantage of high resolution to the light intensity, can be used in optical fingerprint recognition or touch sensing. By sensing lights reflected by the texture of fingerprint, fingerprint can be recognized with improved accuracy of fingerprint recognition.

Herein, "inhibiting" the switch region 142CA is referred to as increasing a value of electric resistance of the semiconductor layer 142 by controlling external electric field (i.e., voltages applied onto the gate electrode 122). On the other hand, "turning on" the switch region 142CA is referred to as decreasing the value of electric resistance of the semiconductor layer 142 by controlling external electric field (i.e., voltages applied onto the gate electrode 122).

In some cases, electric fields at edges of the gate electrode 122 may influence the electric path in the photosensitive region 142CB of the semiconductor layer 142, such that the sensed current may differ from an expected value. For example, when a positive voltage is applied onto the gate electrode 122 to turn on the switch region 142CA, electric fields at edges of the gate electrode 122 may cause a portion of the electric path in the photosensitive region 142CB be opened, such that the sensed current is greater than the expected value. When a negative voltage is applied onto the gate electrode 122 to inhibiting the switch region 142CA, electric fields at edges of the gate electrode 122 may close a portion of electric path in the photosensitive region 142CB, such that the sensed current is less than the expected value.

In some embodiments of the present invention, when view from above, the shielding electrode 124 is at a side of the gate electrode 122 facing the photosensitive region 142CB. For example, the shielding electrode 124 partially overlaps the photosensitive region 142CB of the semiconductor layer 142 along the direction N. In some embodiments, the shielding electrode 124 may be connected to a ground potential. Through the configuration, the shielding electrode 124 may cause shielding effect, thereby preventing the electric fields at edges of the gate electrode 122 from influencing the electric path in the photosensitive region 142CB of the semiconductor layer 142. Therefore, a difference between the sensed current and the expected value can be reduced.

The insulating layer 130 may include dielectric portion 132 that spaces the gate electrode 122 apart from the shielding electrode 124. In some embodiments, a distance L1 of a gap G1 between the gate electrode 122 and the shielding electrode 124 (i.e., a length of the dielectric portion 132) is designed to be as small as possible. In some embodiments, a minimum value of the distance L1 depends on fabrication process resolution. For example, when the fabrication process takes the ability of liquid crystal display fabrication process, the minimum value of the distance L1 may be about 2 micrometers. Alternatively, when the fabrication process takes the ability of integrate circuit fabrication process, the minimum value of the distance L1 may be from about 3 nanometers to about 28 nanometers. In some embodiments, the insulating layer 130 may be formed by suitable insulating materials, such as silicon nitride, silicon oxide, silicon oxynitride, or the combination thereof.

In some embodiments, the substrate 110 may be a rigid substrate having suitable rigidity or a flexible substrate. The substrate 110 made of glass, quartz, organic materials such as polymer materials, other suitable materials, or combination thereof.

In some embodiments, the gate electrode 122 and the shielding electrode 124 may be formed of suitable conductive materials, such as molybdenum, titanium, chromium, tantalum, tungsten, aluminum, copper, other metals, alloys thereof, or combinations thereof. In some embodiments, the gate electrode 122 and the shielding electrode 124 are formed of the same conductive material. For example, a metal layer is deposited on the substrate 110, and then the metal layer is patterned through an etching process to form the gate electrode 122 and the shielding electrode 124.

In some embodiments, the semiconductor layer 142 can be a semiconductor material with a proper energy gap, which can absorb light and change its own resistance accordingly. For example, the semiconductor layer 142 may be formed of a suitable semiconductor material, such as amorphous silicon, other suitable materials, or combination thereof.

In some embodiments, the source/drain electrode 152S and the drain/source electrode 152D may be formed of suitable conductive materials, such as molybdenum, titanium, chromium, tantalum, tungsten, aluminum, copper, and other metals, alloy thereof, or combination thereof. In some embodiments, the source/drain electrode 152S and the drain/source electrode 152D are formed of the same conductive material. For example, a metal layer is deposited on the substrate 110, and then the metal layer is patterned through an etching process to form the source/drain electrode 152S and the drain/source electrode 152D. In some embodiments, the shielding electrode 124 and the gate electrode 122 are adjacent to the source/drain electrode 152S and the drain/source electrode 152D, respectively. In this embodiment, the gate electrode 122 may extend to a position below the drain/source electrode 152D, and the shielding electrode 124 may not extend to a position below the source/drain electrode 152S.

In some embodiments, the photosensitive region 142CB of the semiconductor layer 142 has first to third portions CB1, CB2, and CB3, and the first portion CB1 and the third portion CB3 are respectively connected to two ends of the second portion CB2. In this embodiment, the second portion CB2 overlaps the shielding electrode 124 in the direction N, the first portion CB1 is located between the switch region 142CA and the second portion CB2 and does not overlap the shielding electrode 124 in the direction N, and the third portion CB3 is located on the side of the second portion CB2 away from the first portion CB1 and does not overlap the shielding electrode 124 in the direction N. The first portion CB1 is adjacent to the drain/source electrode 152D, and the third portion CB3 is adjacent to the source/drain electrode 152S. For the convenience of description, the boundary between the first portion CB1 and the second portion CB2 of the photosensitive region 142CB is defined as being aligned to an edge of the shielding electrode 124, and the boundary between the second portion CB2 and the third portion CB3 of the photosensitive region 142CB is defined as being aligned to the other edge of the shielding electrode 124.

In some embodiments, the fringe electric field of the gate electrode 122 is shielded by the shielding electrode 124 (e.g., the electric force line EL is blocked by the shielding electrode 124), such that the fringe electric field of the gate electrode 122 would not affect the second portion CB2 of the photosensitive region 142CB. In some embodiments, since the first portion CB1 of the photosensitive region 142CB is still affected by the fringe electric field of the gate electrode 122 (e.g., part of the electric force line EL extends to the first portion CB1, in order to reduce the influence of the fringe electric field on the measured current, it can be designed that the sum of the length L2 of the second portion CB2 and the length L3 of the third portion CB3 of the photosensitive region 142CB is much larger than the length of the first portion CB1 of the photosensitive region 142CB (i. e., the distance L1). In some embodiments, the length L2 of the second portion CB2 of the photosensitive region 142CB is greater than the length of the first portion CB1 of the photosensitive region 142CB (i. e., the distance L1). In some embodiments, the length L3 of the third portion CB3 of the photosensitive region 142CB is greater than the length of the first portion CB1 of the photosensitive region 142CB (i. e., the distance L1). In the present embodiment, the length L2 of the second part CB2 is greater than the length L3 of the third part CB3. Alternatively, in some other embodiments, the length L3 of the third portion CB3 is greater than the length L2 of the second portion CB2. In other embodiments, the scales of sizes of the first portion CB1, the second portion CB2, and the third portion CB3 of the photosensitive region 142CB of the semiconductor layer 142 can be adjusted arbitrarily, and not limited by those shown in the figure.

Figure 2A:
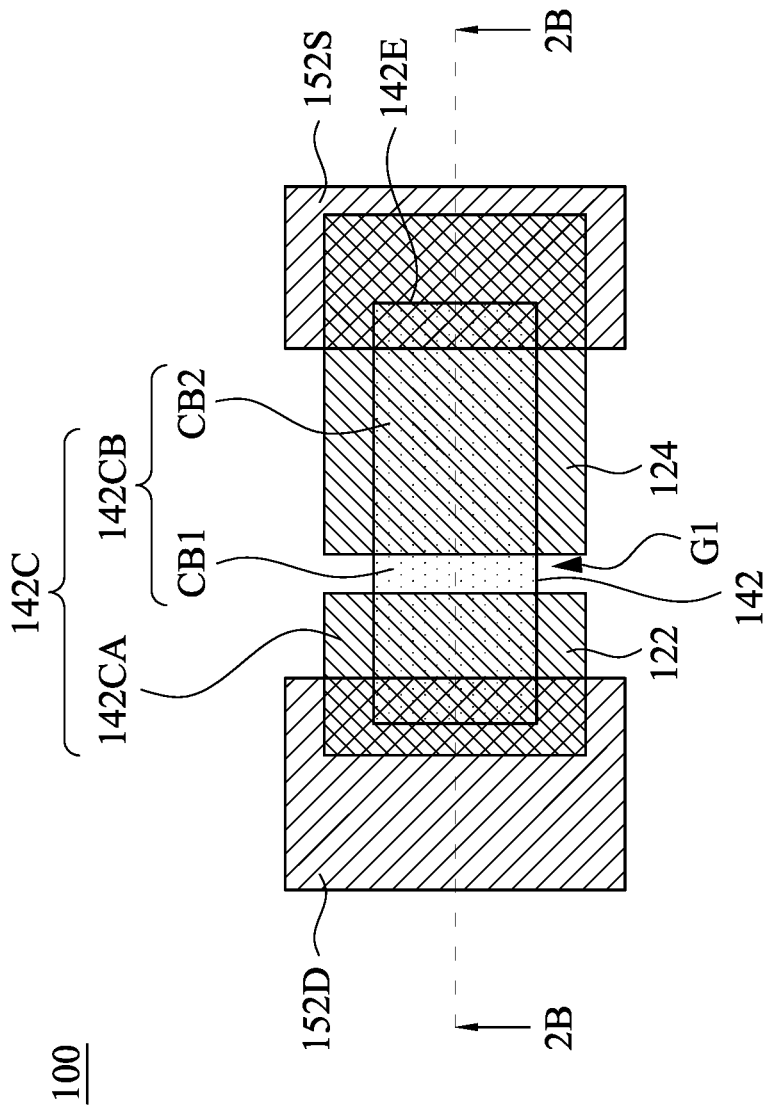
FIG. 2A is a schematic top view of a light sensing device according to some embodiments of the present invention.
Figure 2B:
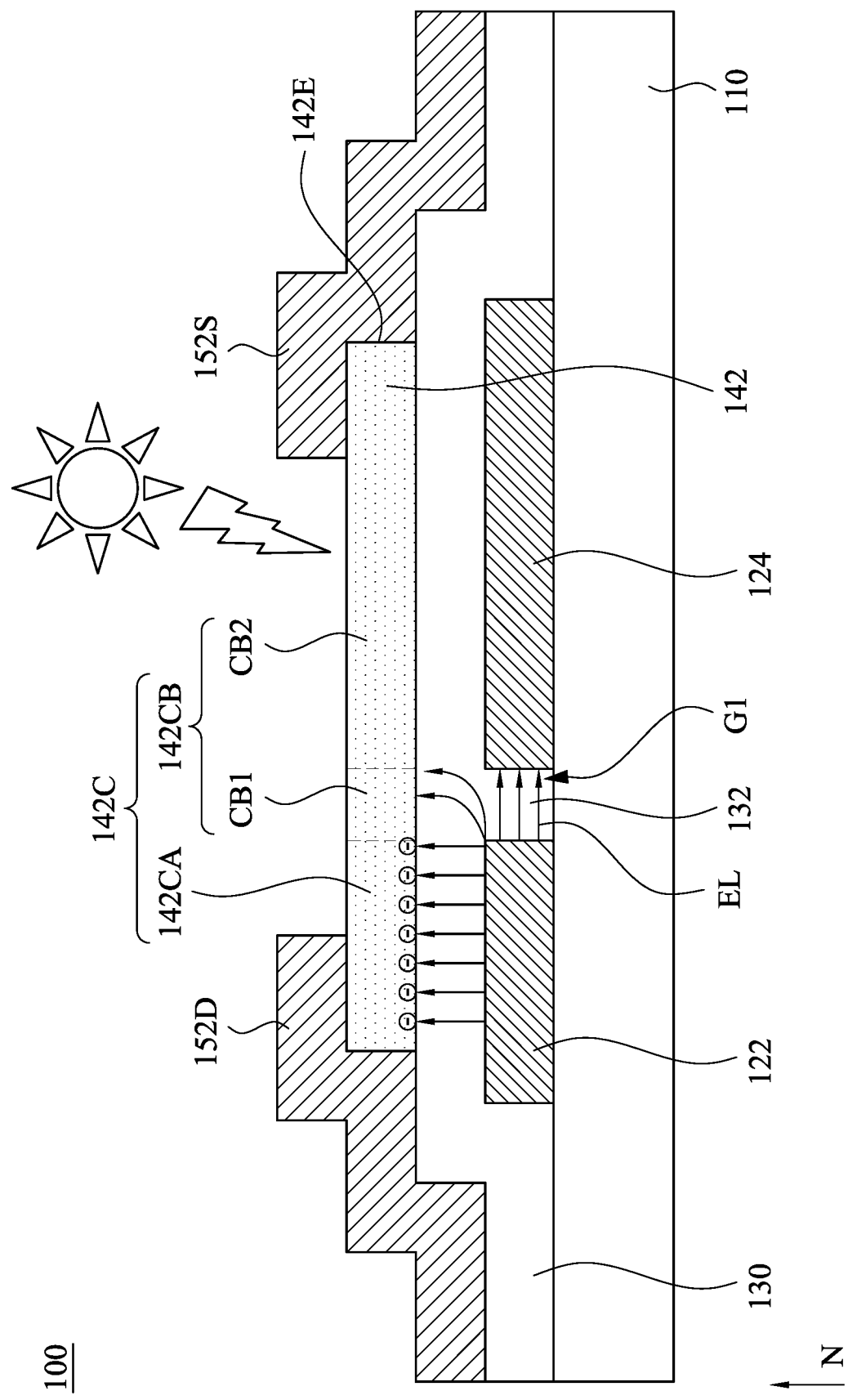
FIG. 2B is a schematic cross-sectional view taken along line 1B-1B of FIG. 1A.

FIG. 2A is a schematic top view of a light sensing device 100 according to some embodiments of the present invention. FIG. 2B is a schematic cross-sectional view taken along the line 2B-2B of FIG. 2A. The present embodiment is similar to FIGS. 1A and 1B, except that the shielding electrode 124 extends to a position below the source/drain electrode 152S. The shielding electrode 124 can extend beyond the side 142E of the semiconductor layer 142 so that the photosensitive region 142CB of the semiconductor layer 142 is almost completely over the shielding electrode 124.

For example, herein, the photosensitive region 142CB of the semiconductor layer 142 has a first portion CB1 and a second portion CB2, the second portion CB2 overlaps the shielding electrode 124 in the direction N, and the first portion CB1 is between the switch region 142CA and the second portion CB2 and does not overlap with the shielding electrode 124 in the direction N. In other words, in this embodiment, the semiconductor layer 142 may not have the third portion CB3 (referring to FIGS. 1A and 1B). Other details of this embodiment are similar to those illustrated above, and will not be repeated herein.

Figure 3A:
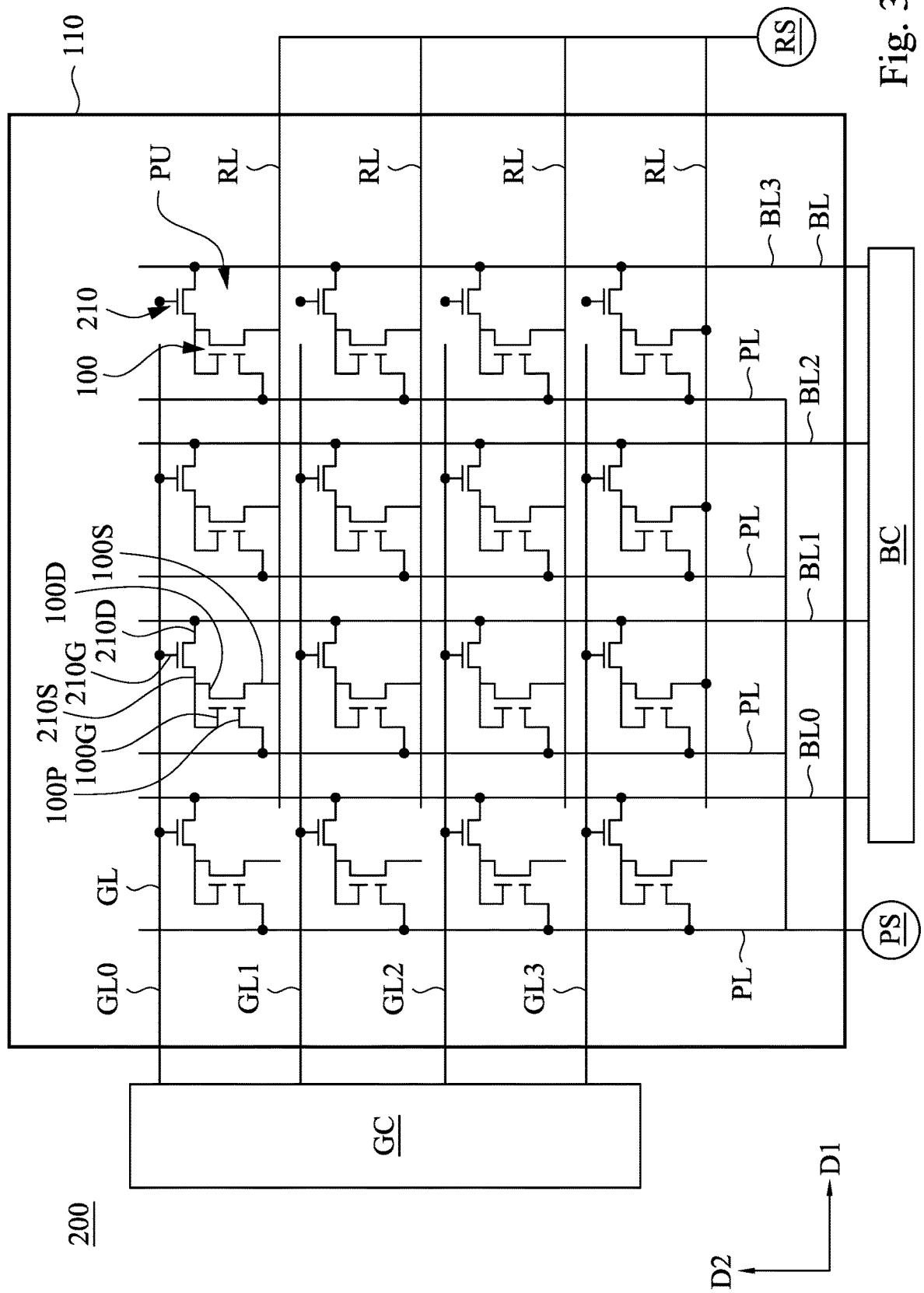
FIG. 3A is a schematic top view of a light sensing panel according to some embodiments of the present invention.
Figure 3B:
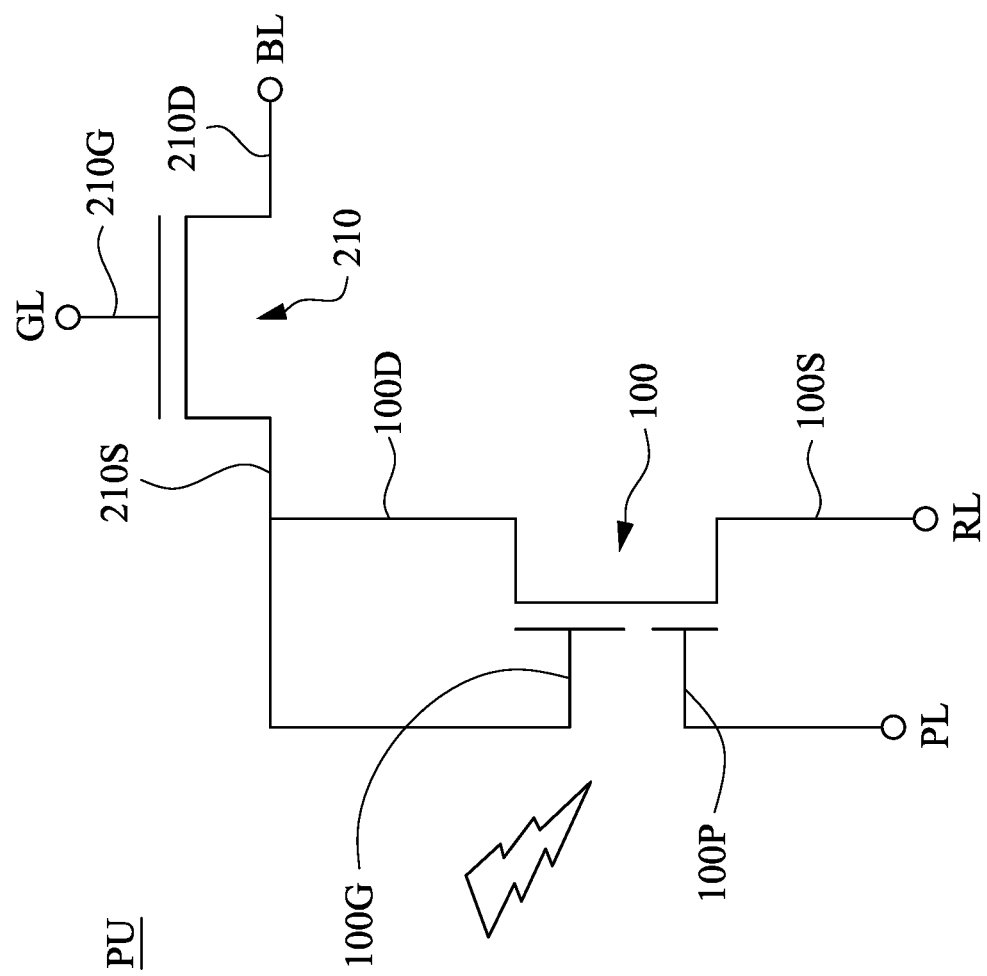
FIG. 3B is a schematic circuit diagram of a pixel unit of the light sensing panel of FIG. 3A.

FIG. 3A is a schematic top view of a light sensing panel 200 according to some embodiments of the present invention. FIG. 3B is a schematic circuit diagram of the pixel unit PU of the light sensing panel 200 of FIG. 3A. In this embodiment, the light sensing panel 200 includes a plurality of scan lines GL (e.g., scan lines GL0~GL3), bias lines BL (e.g., bias lines BL0~BL3), low potential lines RL, shielding potential lines PL, multiple pixel units PU, scan circuit GC, and bias circuit BC.

In some embodiments of the present invention, the scan lines GL, the bias lines BL, and the low potential lines RL are not electrically connected to each other. In some embodiments, the scan lines GL extend along the first direction D1, and the bias lines BL extends along the second direction D2, wherein the first direction D1 intersects the second direction D2. For example, the first direction D1 and the second direction D2 are orthogonal to each other. The low potential lines RL and the shielding potential lines PL are appropriately distributed respectively. In this embodiment, the low potential lines RL extend along the first direction D1 and is parallel to the scan lines GL, and the shielding potential lines PL extend along the second direction D2 and is parallel to the bias lines BL. Of course, it should not limit the scope of the present invention. In some other embodiments, the low potential lines RL may extend along the second direction D2 and be parallel to the bias lines BL, and the shielding potential lines PL may extend along the first direction D1 and be parallel to the scan line GLs. In still other embodiments, the low potential lines RL and the shielding potential lines PL may extend in the same direction, for example, the first direction D1 or the second direction D2.

In this embodiment, each pixel unit PU is connected to a scan line GL (e.g., scan lines GL0~GL3) and a bias line BL (e.g., bias lines BL0~BL3). The scan line GL (e.g., scan lines GL0~GL3) can be connected to the scan circuit GC to provide signals to the pixel unit PU in a sequential manner. The bias line BL (e.g., the bias lines BL0~BL3) can be connected to the bias circuit BC to provide signals to the pixel unit PU in a sequential manner. The low potential line RL is connected to a low potential source RS, in which the low potential source RS provides a suitable stable bias potential, such as a ground potential. The shielding potential line PL is connected to a shielding potential source PS, which provides a suitable stable bias potential, such as a ground potential.

In some embodiments, each pixel unit PU includes a light sensing device 100 and a sensing switch device 210. The light sensing device 100 includes a control terminal 100G, a first terminal 100S, a second terminal 100D, and a shielding terminal 100P. A resistance between the first terminal 100S and the second terminal 100D can be controlled by light and the control terminal 100G, such that the light sensing device 100 can sense light. For example, the control terminal 100G, the first terminal 100S, the second terminal 100D, and the shielding terminal 100P of the light sensing device 100 respectively correspond to the gate electrode 122, the source/drain electrode 152S, and the drain/source electrode 152D, and the shielding electrode 124 of FIGS. 1A to 2B.

In this embodiment, the sensing switch device 210 includes a control terminal 210G, a first terminal 210S, and a second terminal 210D, in which the control terminal 210G is configured to control whether or not to establish the electrical conduction between the signal terminals (e.g., the first terminal 210S and the second terminal 210D). In this embodiment, the control terminal 210G is electrically connected to the scan line GL, the first terminal 210S is electrically connected to the control terminal 100G and the second terminal 100D of the light sensing device 100, and the second terminal 210D is electrically connected to the bias line BL. In this embodiment, the first terminal 100S can be connected to the low potential line RL.

A potential of the low potential source RS can be lower than a potential of the signal time-sequentially provided by the bias circuit BC, so that there is a voltage difference between the bias line BL and the low potential line RL. Through the configuration, when the sensing switch device 210 is turned on through the scan line GL, when the light sensing device 100 senses light, the current provided by the bias line BL can flow through the second terminal 210D of the sensing switch device 210 to the first terminal 210S and the control terminal 100G, thereby turning on the control terminal 100G of the light sensing device 100, and then flow through the second terminal 100D of the light sensing device 100 to the first terminal 100S to the low potential line RL, in which a value of electrical resistance between the second terminal 100D and the first terminal 100S of the light sensing device 100 is influenced by light. Through the configuration, by monitoring the current value, an intensity of the light sensed by the light sensing device 100 can be determined. For example, a value of the current flow from the bias line BL to the ground potential (such as the potential of the low potential source RS or a ground potential in the bias circuit BC) can be measured to determine the intensity of the sensed light. In some embodiments, since the intensity of the sensed light is known through the current carried by the bias line BL, the bias line BL may also be referred to as a readout line.

In some embodiments, the shielding terminal 100P of the light sensing device 100 may be electrically connected to the shielding potential line PL to cause a shielding effect and improve the sensitivity accuracy of the light sensing device 100. In some embodiments, the scan line GL, the bias line BL, and the shielding potential line PL are electrically disconnected from each other. The shielding potential line PL may be electrically connected to or disconnected from the low potential line RL.

Figure 3C:
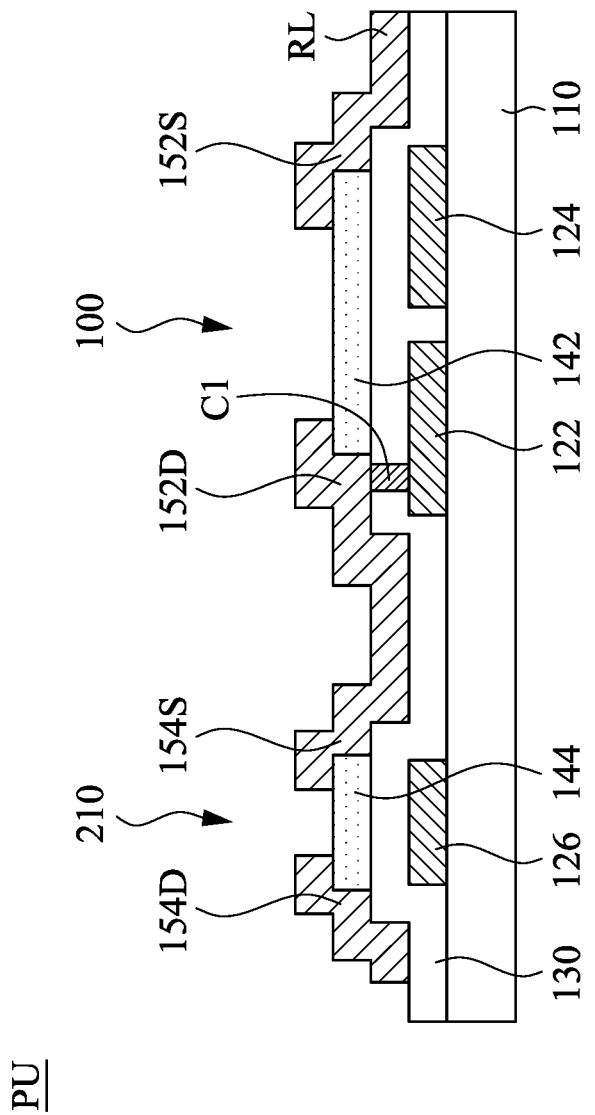
FIG. 3C is a schematic cross-sectional view of the pixel unit of FIG. 3B.
Figure 3D:
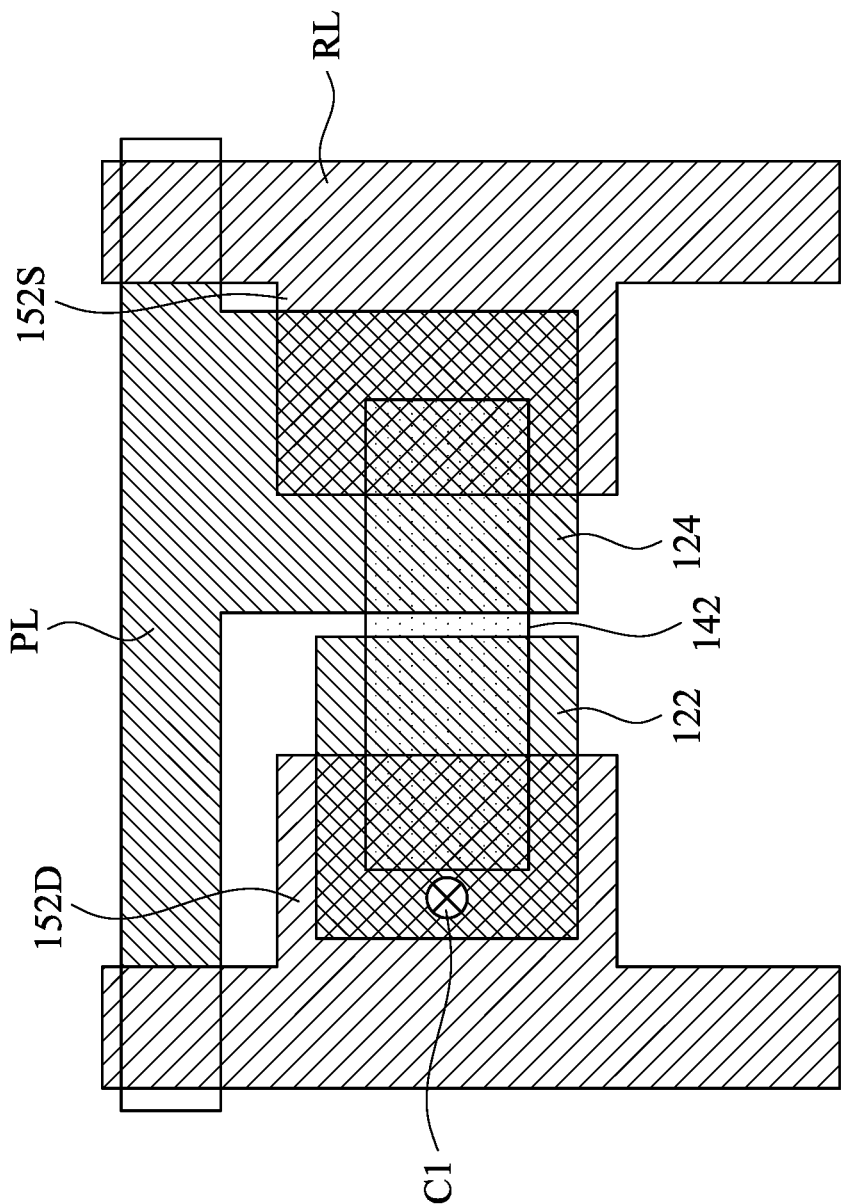
FIG. 3D is a schematic top view of the pixel unit of FIG. 3C.

FIG. 3C is a schematic cross-sectional view of the pixel unit PU of FIG. 3B. FIG. 3D is a schematic top view of the pixel unit PU of FIG. 3C. The insulating layer 130 may be provided with a contact C1 to connect the gate electrode 122 and the drain/source electrode 152D of the light sensing device 100, thereby achieving electrical connection between the gate electrode 122 and the drain/source electrode 152D. Through the configuration, the circuit configuration of FIG. 3B can be achieved. In some embodiments, a contact opening is etched in the insulating layer 130 by etching process and then filled with a conductive material, and a planarization process is performed to remove the conductive material outside the contact opening, thereby forming the contact C1. The conductive material of the contact C1 may be, for example, molybdenum, titanium, chromium, tantalum, tungsten, aluminum, copper, other metals, alloys thereof, or combinations thereof.

In some embodiments, the sensing switch device 210 may include a gate electrode 126, a semiconductor layer 144, a first source/drain electrode 154S, and a second drain/source electrode 154D. The gate electrode 126, the first source/drain electrode 154S, and the second drain/source electrode 154D of the sensing switch device 210 can respectively constitute the control terminal 210G, the first terminal 210S, and the second terminal 210D of the sensing switch device 210 of FIGS. 3A and 3B. In the present embodiment, the gate electrode 126 is over the substrate 110 and is spaced from the gate electrode 122 and the shielding electrode 124. The insulating layer 130 is over the gate electrode 126. The semiconductor layer 144 is over the insulating layer 130. The first source/drain electrode 154S and the second drain/source electrode 154D are respectively connected to the semiconductor layer 144.

In some embodiments, the gate electrode 126 of the sensing switch device 210 and the gate electrode 122 of the light sensing device 100 are formed by patterning the same layer. In some embodiments, the semiconductor layer 144 of the sensing switch device 210 and the semiconductor layer 142 of the light sensing device 100 are formed by patterning the same semiconductor layer. In some embodiments, the source/drain electrode 154S and the second drain/source electrode 154D of the sensing switch device 210 and the source/drain electrode 152S and drain/source electrode 152D of the light sensing device 100 is formed by patterning the same conductive layer. Accordingly, the gate electrode 126, the semiconductor layer 144, the source/drain electrode 154S, and the drain/source electrode 154D of the sensing switch device 210 respectively have the same materials and the similar layer thickness as that of the gate electrode 122, the semiconductor layer 142, the semiconductor layer 142, the source/drain electrode 152S, and the drain/source electrode 152D of the light sensing device 100. The source/drain electrode 154S can be structurally connected to the drain/source electrode 152D as the circuit configuration show in FIG. 3B. In many embodiments of the present invention, the light sensing device 100 and the sensing switch device 210 may adopt N-type channels or P-type channels, and are not limited to those shown in the figure. In addition, in one embodiment, the semiconductor layer 142 and the semiconductor layer 144 may include amorphous silicon and n-type lightly doped (n+) amorphous silicon.

Returning to FIG. 3B, in this embodiment, the low potential source RS and the shielding potential source PS may be at different voltage potentials, and the shielding potential line PL may be electrically disconnected from the low potential line RL. Alternatively, in some other embodiments, the low potential source RS and the shielding potential source PS have the same potential, such as a ground potential, and the shielding potential line PL can be electrically connected to the low potential line RL. In some embodiments where the shielding potential line PL is electrically connected to the low potential line RL, the shielding electrode 124 (or the shielding potential line PL) may be structurally connected to the first terminal 100S (or the low potential line RL) of the light sensing device 100, or the shielding potential line PL may be structurally connected to the low potential line RL. Please refer to the following FIGS. 4A and 4B.

Figure 4A:
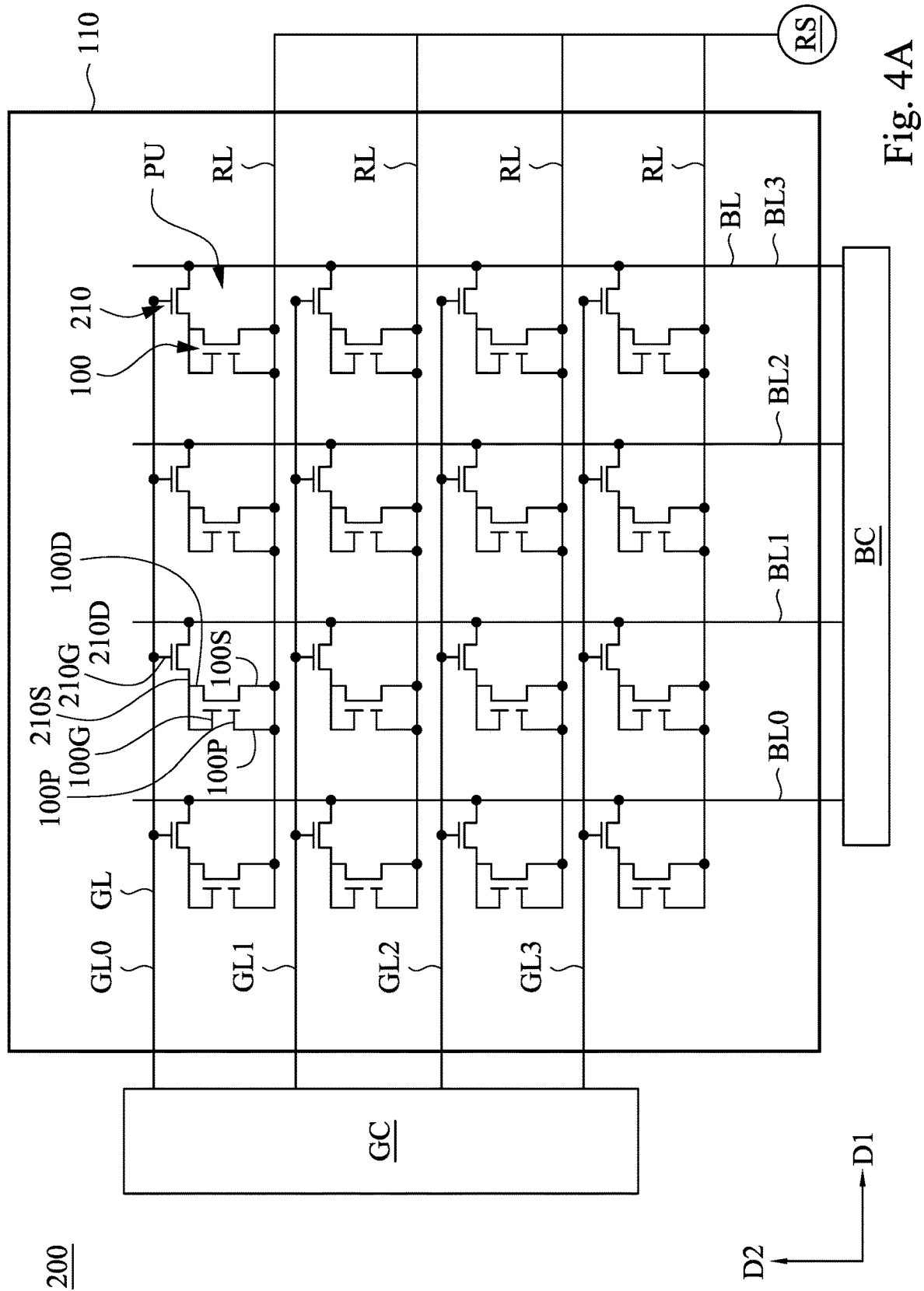
FIG. 4A is a schematic top view of a light sensing panel according to some embodiments of the present invention.
Figure 4B:
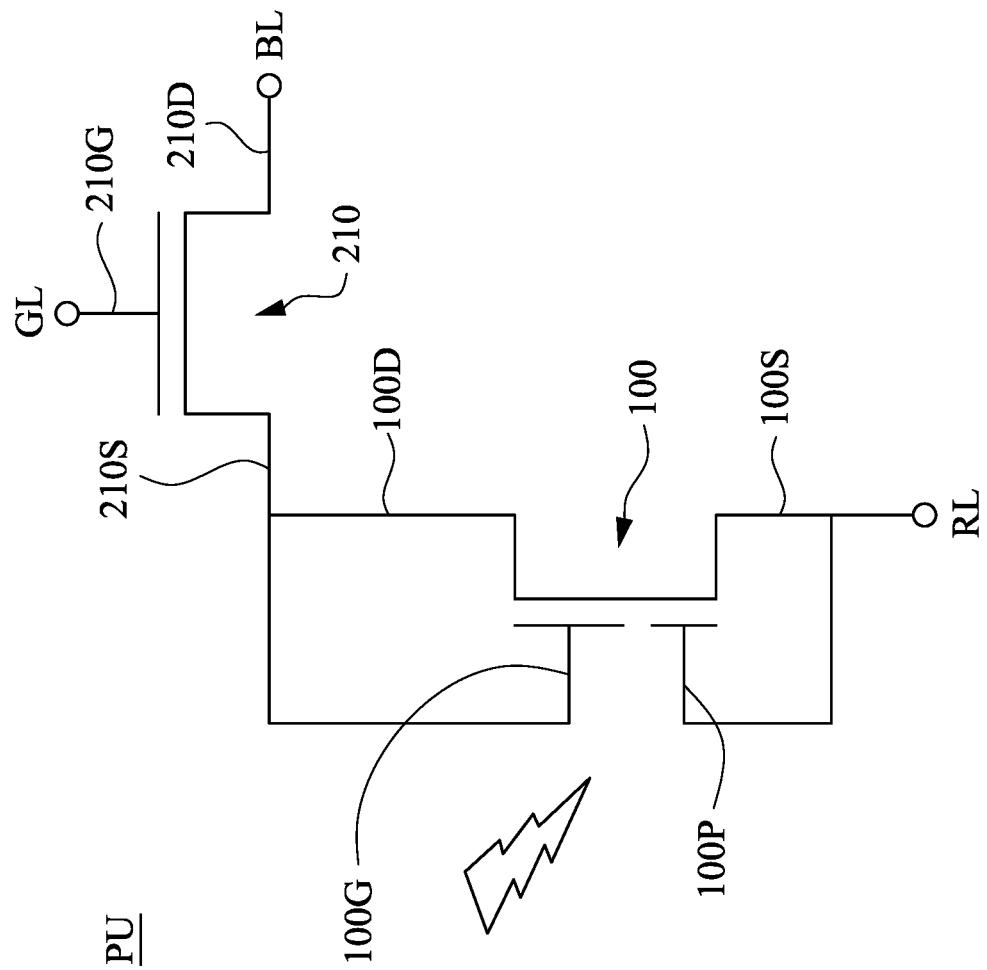
FIG. 4B is a schematic circuit diagram of a pixel unit of the light sensing panel of FIG. 4A.

FIG. 4A is a schematic top view of a light sensing panel 200 according to some embodiments of the present invention. FIG. 4B is a schematic circuit diagram of the pixel unit PU of the light sensing panel 200 of FIG. 4A. This embodiment is similar to the embodiments of FIGS. 3A and 3B, except that: in this embodiment, the first terminal 100S and the shielding terminal 100P of the light sensing device 100 can be connected to the same low potential source RS through the low potential line RL, in which the low potential source RS provides a suitable stable bias potential, such as a ground potential. Through the configuration, the configuration of the shielding potential line PL and the shielding potential source PS (referring to FIGS. 3A and 3B) can be omitted.

Figure 4C:
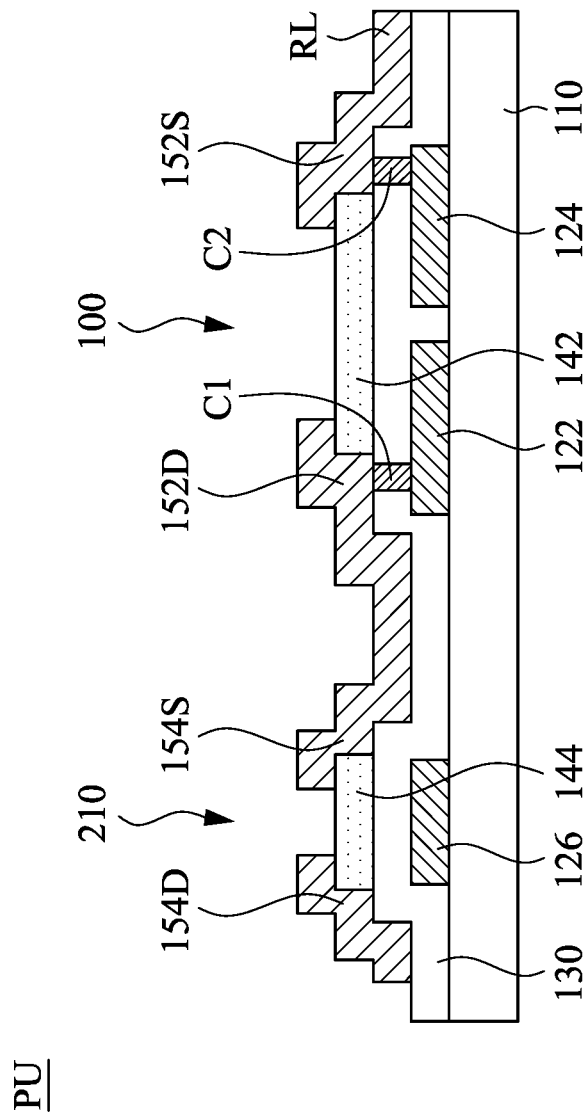
FIG. 4C is a schematic cross-sectional view of the pixel unit of FIG. 4B.
Figure 4D:
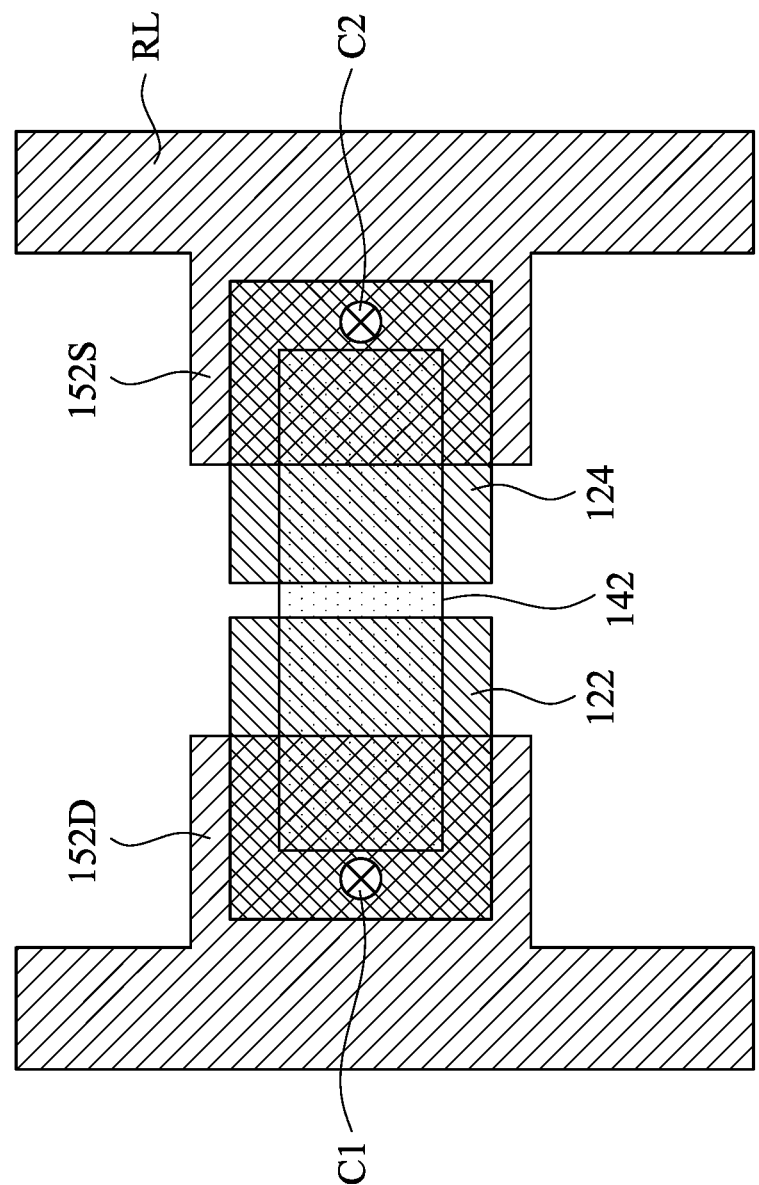
FIG. 4D is a schematic top view of the pixel unit of FIG. 4C.

FIG. 4C is a schematic cross-sectional view of the pixel unit PU of FIG. 4B. FIG. 4D is a schematic top view of the pixel unit PU of FIG. 4C. In this embodiment, a contact C2 may be provided in the insulating layer 130 to connect the shielding electrode 124 and the source/drain electrode 152S of the light sensing device 100, thereby achieving electrical connection between the shielding electrode 124 and the source/drain electrode 152S. In some embodiments, contact openings are etched in the insulating layer 130 by etching process and then filled with a conductive material, and a planarization process is performed to remove the conductive material outside the contact openings, thereby forming the contacts C1 and C2. For example, the conductive materials of the contacts C1 and C2 may be molybdenum, titanium, chromium, tantalum, tungsten, aluminum, copper, other metals, alloys thereof, or combinations thereof. Other details of this embodiment are the same as those of the embodiment of FIGS. 3A to 3D, and will not be repeated herein.

Figure 5A:
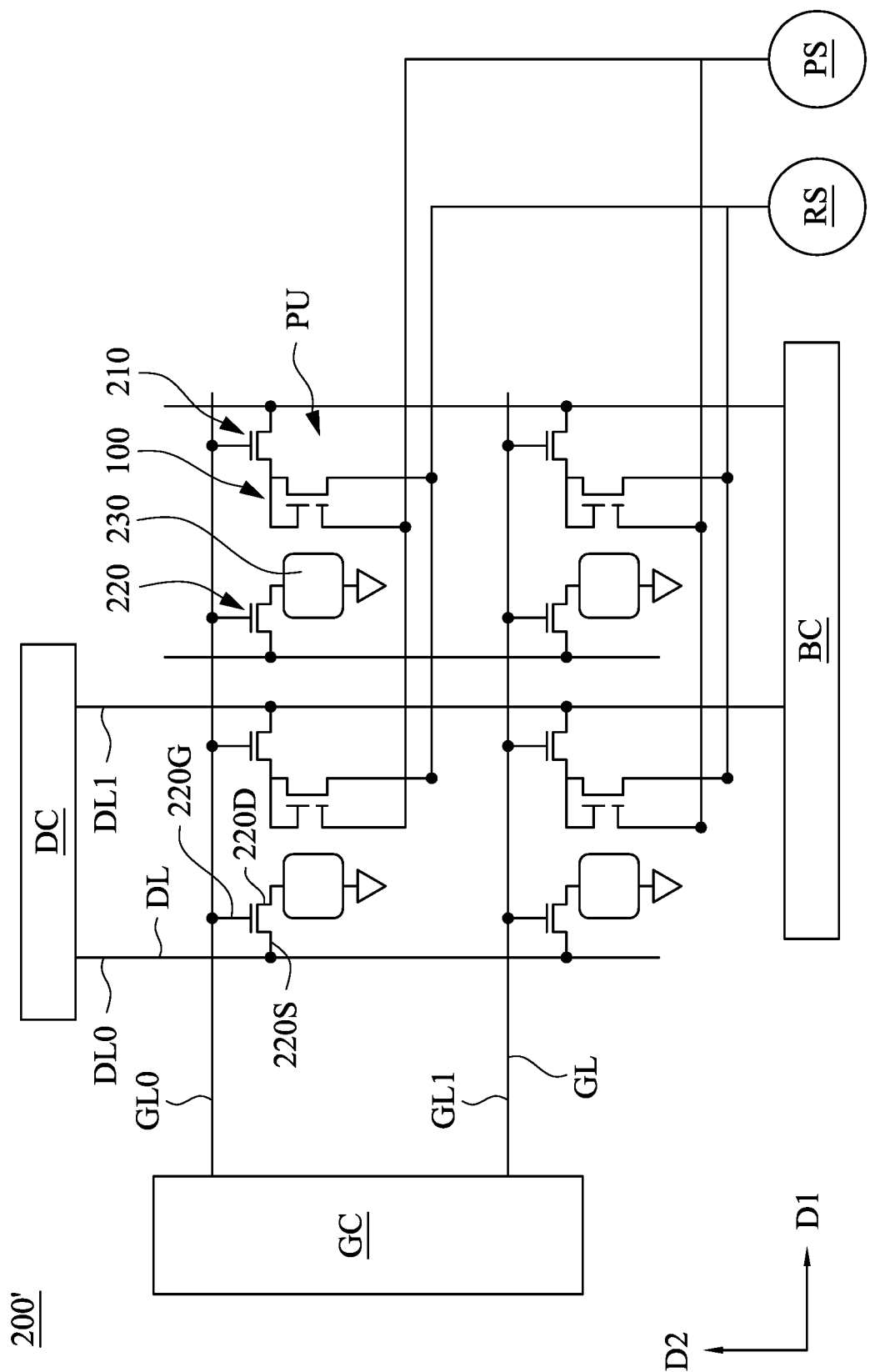
FIG. 5A is a schematic top view of a light sensing panel according to some embodiments of the present invention.

FIG. 5A is a schematic top view of a light sensing display panel 200' according to some embodiments of the present invention. This embodiment is similar to FIGS. 3A and 3B, except that: in this embodiment, the light sensing display panel 200' may further include data lines DL (e.g., data lines DL0, DL1) and a data driving circuit DC, and the pixel unit PU may further include a display switch device 220 and a pixel electrode 230, so that the light sensing display panel 200' can achieve a display function.

In some embodiments, the data driving circuit DC is configured to time-sequentially provide appropriate data signals to each data line DL. The display switch device 220 may include a control terminal 220G, a first terminal 220S, and a second terminal 220D, wherein the control terminal 220G is used to control whether or not to establish the electrical conduction between the first terminal 220S and the second terminal 220D. The control terminal 220G can be connected to the scan line GL. The first terminal 220S and the second terminal 220D of the display switch device 220 are respectively connected to the data line DL and the pixel electrode 230. Thereby, through the control of the scan circuit GC and the scan line GL, the data signals provided by the data driving circuit DC can be transmitted to each pixel electrode 230 in a time sequence through the data line DL, and then the light intensity of each pixel can be controlled to achieve the display purpose. In an embodiment, the light sensing display panel 200' may be a liquid crystal display panel (LCD) or an organic light-emitting diode (Active-matrix organic light-emitting diode; AMO-LED) panel, but it is not limited thereto.

In this embodiment, since the display switch device 220 and the sensing switch device 210 of the same pixel unit PU are controlled by the same scan line GL (i.e., scan lines GL0, GL1), the display switch device 220 and the sensing switch device 210 of the same pixel unit PU can be turned on at the same time point. Through the configuration, at the same time point, the pixel unit PU can achieve display function by using the display switch device 220 to conduct the data line DL and the pixel electrode 230, and achieving the purpose of sensing light by using the sensing switch device 210 to conduct the light sensing device 100 and the bias line BL. By arranging the light sensing device 100 and the pixel electrode 230 in the same pixel unit PU, the resolution of the light sensing device 100 is equivalent to the resolution of the pixel electrode 230 used for display, thereby improving the sensing resolution, which in turn will achieve applications like fingerprint recognition.

Figure 5B:
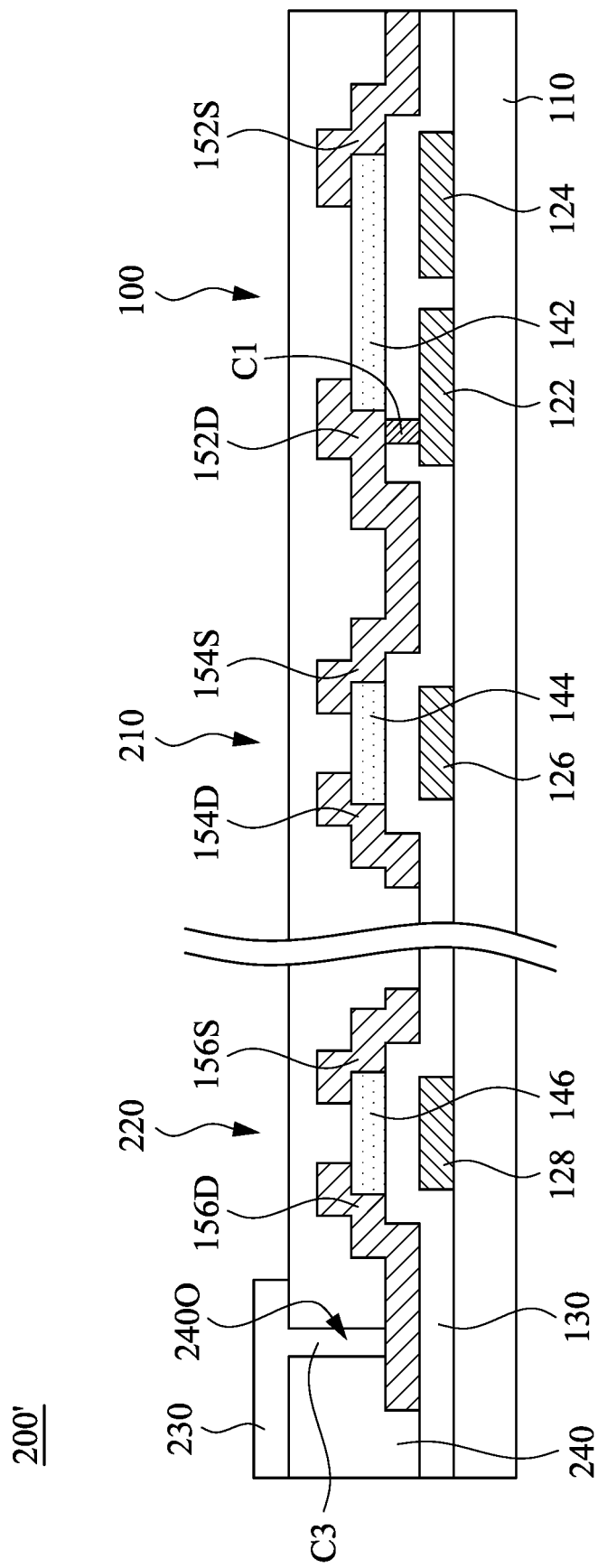
FIG. 5B is a schematic cross-sectional view of a portion of the light sensing panel of FIG. 5A.

FIG. 5B is a schematic cross-sectional view of a portion of the light sensing display panel 200' of FIG. 5A. In some embodiments, the display switch device 220 may include a gate electrode 128, a semiconductor layer 146, a source/drain electrode 156S, and a drain/source electrode 156D. The gate electrode 128, the source/drain electrode 156S, and the drain/source electrode 156D of the display switching device 220 can respectively constitute the control terminal 220G, the first terminal 220S, and the second terminal 220D of the display switch device 220 in FIG. 5A. In this embodiment, the gate electrode 128 is over the substrate 110 and spaced apart from the gate electrodes 122 and 126 and the shielding electrode 124. The insulating layer 130 is over the gate electrode 128. The semiconductor layer 146 is over the insulating layer 130. The source/drain electrode 156S and the drain/source electrode 156D are respectively connected to the semiconductor layer 146.

In some embodiments, the gate electrodes 128, 122, 126 and the shielding electrode 124 are formed by patterning the same layer, and therefore have the same material and similar thickness. In some embodiments, the semiconductor layers 146, 142, and 144 are formed by patterning the same layer, and therefore have the same material and similar thickness. In some embodiments, the drain/source electrodes 156D, 152D, and 154D and the source/drain electrodes 152S, 154S, and 156S are formed by patterning the same layer, and therefore have the same material and similar thickness.

In some embodiments, an insulating layer 240 may be deposited on the device. The insulating layer 240 may be formed of a suitable insulating material, such as silicon nitride, silicon oxide, silicon oxynitride, or a combination thereof. The pixel electrode 230 may be disposed on the insulating layer 240, and may be formed of a suitable transparent or opaque conductive material. The opaque conductive material may be a metal, such as molybdenum, titanium, chromium, tantalum, tungsten, aluminum, copper, other metals, alloys thereof, or combinations thereof. The transparent conductive material can be, for example, indium tin oxide, nano metal wire (such as nano silver wire), or a combination thereof, and the light transmittance thereof can be greater than 60% or greater than 80%. An opening 240O can be etched in the insulating layer 240 and filled with a suitable conductive material to form the contact C3, so that the pixel electrode 230 is electrically connected to the drain/source electrode 156D through the contact C3. In some embodiments, a suitable transparent or opaque conductive material may be deposited on the insulating layer 240 and into the opening 240O, and then be patterned to form the pixel electrode 230 With contact C3 through process steps such as photolithography and etching processes. Other details are similar to those described in the previous related embodiments in FIGS. 3A and 3B, and will not be repeated herein.

Figure 6:
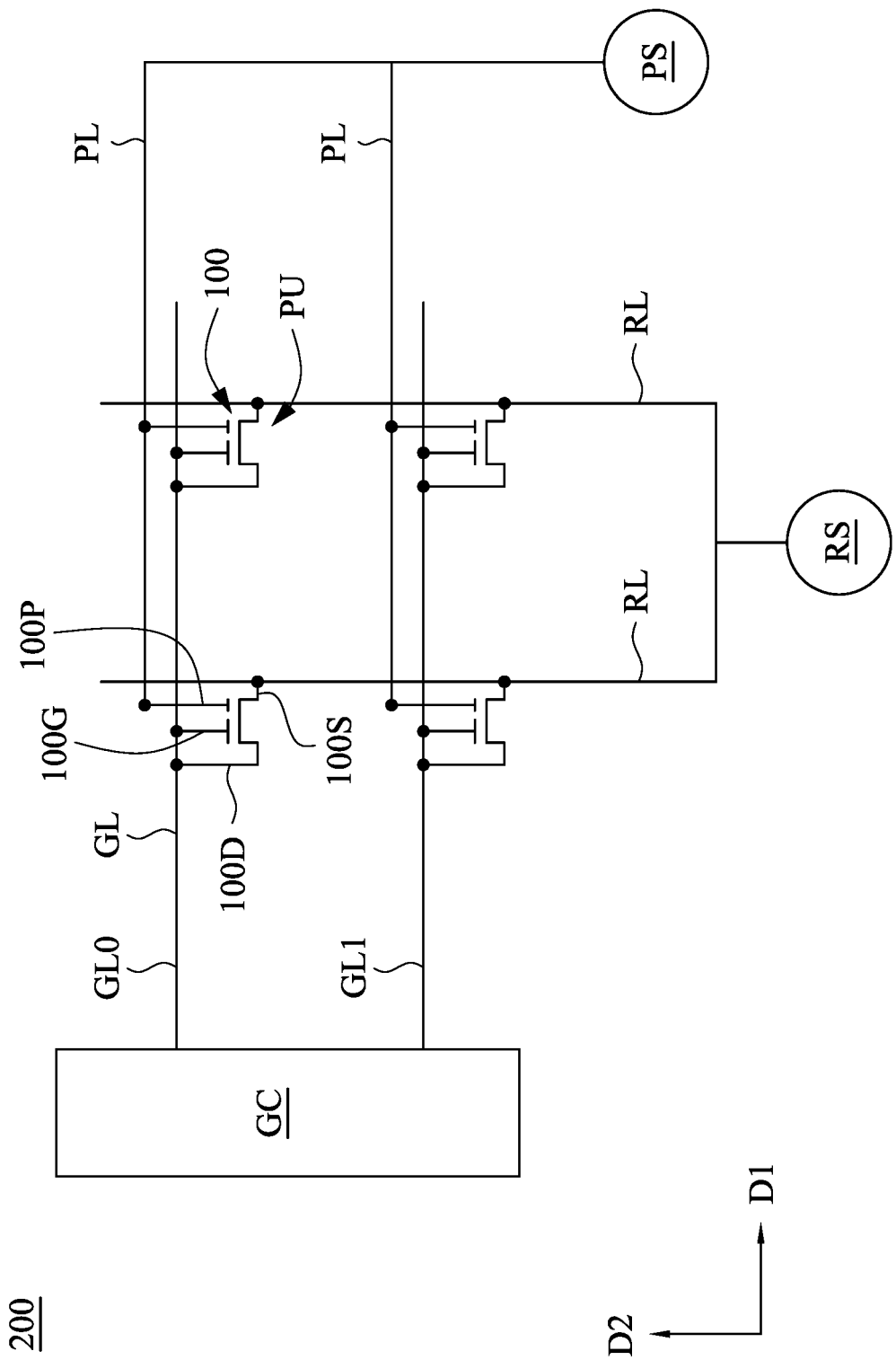
FIG. 6 is a schematic top view of a light sensing panel according to some embodiments of the present invention.

FIG. 6 is a schematic top view of a light sensing panel 200 according to some embodiments of the present invention. This embodiment is similar to FIGS. 3A to 3D and FIGS. 4A to 4D, except that the pixel unit PU of the light sensing panel 200 does not include the sensing switch device 210. In this embodiment, by adjusting the configuration of the gate electrode 122 and the semiconductor layer 142 (referring to FIGS. 1A and 1B, for example, adjusting the length of the switch region 142CA or shielding the switch region 142CA), the light sensing device 100 itself may be capable of inhibiting the conduction when the pixel unit PU is exposed to light, such that the light sensing device 100 itself may works without being accompanied by the sensing switch device 210 (referring to FIG. 5).

In this embodiment, the second terminal 100D and the control terminal 100G of the light sensing device 100 are connected to the scan line GL, and the first terminal 100S of the light sensing device 100 is connected to the low potential line RL. Though the configuration, when the light sensing device 100 senses light and changes (e.g., reduces) the resistance value of the semiconductor layer, the signal of the scan line GL will be transmitted from the second terminal 100D to the first terminal 100S, and then to the low potential line. RL. In this embodiment, the shielding terminal 100P of the light sensing device 100 is connected to the shielding potential source PS via the shielding potential line PL. Other details of this embodiment are similar to those described above, and will not be repeated herein.

Figure 7:
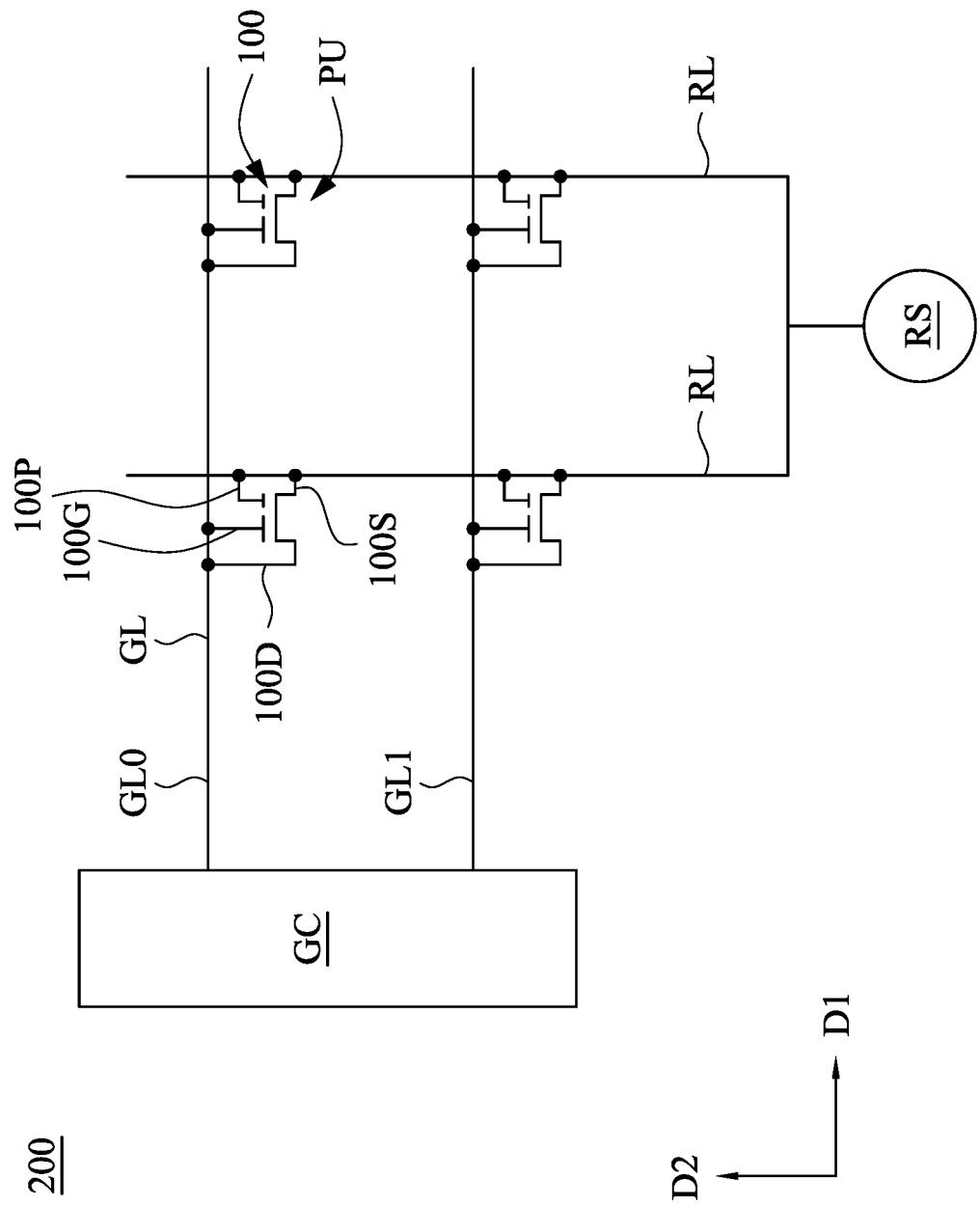
FIG. 7 is a schematic top view of a light sensing panel according to some embodiments of the present invention.

FIG. 7 is a schematic top view of a light sensing panel 200 according to some embodiments of the present invention. This embodiment is similar to FIG. 6, except that the shielding terminal 100P of the light sensing device 100 can be directly connected to the first terminal 100S of the light sensing device 100, and therefore be connected to the low potential source RS via the low potential line RL, in which the configuration of the shielding potential line PL and the shielding potential source PS (refer to FIG. 6) can be omitted. For the specific structure of the light sensing device 100 of this embodiment, reference can be made to the light sensing device 100 of FIGS. 4C and 4D, and other details will not be repeated herein.

Figure 8:
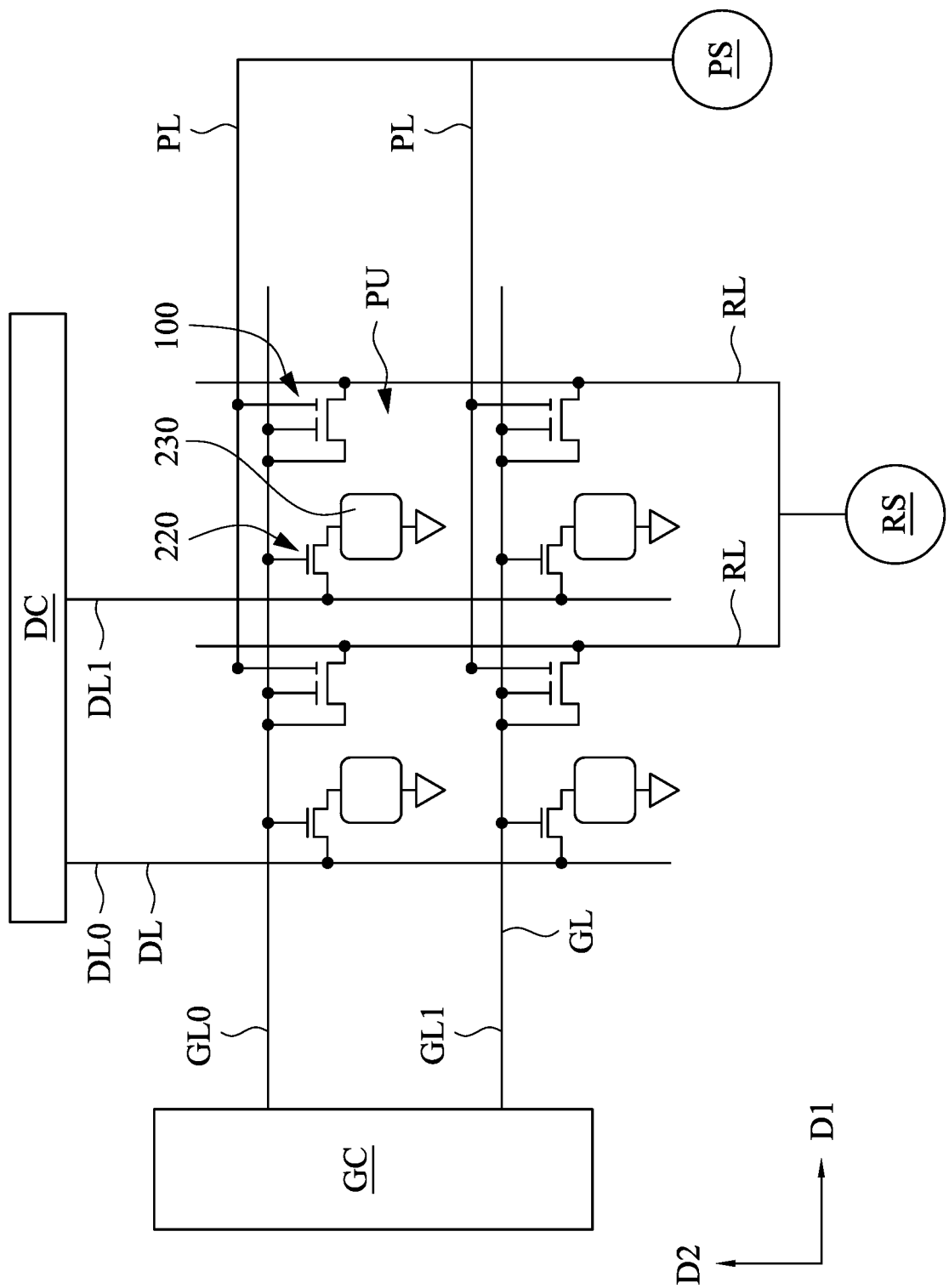
FIG. 8 is a schematic top view of a light sensing panel according to some embodiments of the present invention.

FIG. 8 is a schematic top view of a light sensing display panel 200' according to some embodiments of the present invention. This embodiment is similar to FIG. 6 except that: in this embodiment, the pixel unit PU may further include a display switch device 220 and a pixel electrode 230, so that the light sensing display panel 200' can achieve a display function. For the specific structure of the display switch device 220 and the pixel electrode 230 of this embodiment, reference can be made to the configuration of FIG. 5B; for the specific structure of the light sensing device 100, reference can be made to the light sensing device 100 of FIGS. 4C and 4D; and other details are similar to those described in the embodiments in FIG. 6, will not be repeated herein.

In some embodiments of this context, the electrodes 152D, 154D, and 156D may be referred to as first drain/source electrodes, and the electrodes 152S, 154S, and 156S may be referred to as second source/drain electrodes. Alternatively, in some embodiments herein, the electrodes 152S, 154S, and 156S may be referred to as first source/drain electrodes, and the electrodes 152D, 154D, and 156D may be referred to as second drain/source electrodes.

In some embodiments of the present invention, a shielding electrode is designed in the light sensing device to cause a shielding effect, such that the electron channel in the photosensitive region in the semiconductor layer can be prevented from being affected by the electric field at the edge of the gate electrode. This light sensing device has the advantage of high light intensity resolution and can be used for optical fingerprint recognition. By sensing the reflected light from the fingerprint texture, fingerprint recognition can be achieved, and the accuracy of fingerprint recognition can be improved. In some embodiments, by designing the light-sensing device with a gate electrode to control part of the channel, the light-sensing device can simultaneously achieve the functions of light sensing and switching. In some embodiments, light sensing devices can be applied to a display panel, and the light sensing devices can be manufactured along with the devices and the pixel electrodes in the display panel through a suitable integrated process, thereby saving masks.

The foregoing outlines features of several embodiments so that those skilled in the art may better understand the aspects of the present disclosure. Those skilled in the art should appreciate that they may readily use the present invention as a basis for designing or modifying other processes and structures. Those skilled in the art should also realize that such equivalent constructions do not depart from the spirit and scope of the present invention, and that they may make various changes, substitutions, and alterations herein without departing from the spirit and scope of the present invention.

What is claimed is:

1. A light sensing device, comprising:
   a substrate;
   a gate electrode over the substrate;
   a shielding electrode over the substrate and spaced apart from the gate electrode;
   an insulating layer over the gate electrode and the shielding electrode, wherein a top surface of the gate electrode and a top surface of the shielding electrode are in contact with a bottom surface of the insulating layer, and the gate electrode and the shielding electrode has a gap therebetween;
   a semiconductor layer over the insulating layer; and
   a first drain/source electrode and a second source/drain electrode respectively connected to the semiconductor layer, wherein the semiconductor layer has a channel region between the first drain/source electrode and the second source/drain electrode, the channel region is divided into a first region and a second region, the first region is adjacent to the first drain/source electrode and overlapping the gate electrode, the second region is adjacent to the second source/drain electrode and not overlapping the gate electrode, and the second region partially overlaps the shielding electrode.

2. The light sensing device of claim 1, wherein the shielding electrode extends to a position below the second source/drain electrode.

3. The light sensing device of claim 1, wherein the shielding electrode does not extend to a position below the second source/drain electrode.

4. The light sensing device of claim 1, wherein the gate electrode and the shielding electrode are made of a same conductive material.

5. The light sensing device of claim 1, wherein the shielding electrode is electrically connected to the second source/drain electrode.

6. The light sensing device of claim 1, wherein the gate electrode is electrically connected to the first drain/source electrode.

7. A light sensing panel, comprising:
the light sensing device of claim 1;
a scan line over the substrate;
a bias line over the substrate;
a sensing switch device over the substrate, wherein a control terminal of the sensing switch device is electrically connected to the scan line, and two terminals of the sensing switch device are respectively connected to the bias line and the first drain/source electrode of the light sensing device; and
a low potential line over the substrate and electrically connected to the second source/drain electrode of the light sensing device.

8. The light sensing panel of claim 7, wherein the shielding electrode is electrically connected to the low potential line or a shielding potential line over the substrate.

9. The light sensing panel of claim 8, further comprising:
at least one data line over the substrate;
a display switch device, wherein a control terminal of the display switch device is connected to the scan line; and
a pixel electrode, wherein two terminals of the display switch device are respectively connected to the data line and the pixel electrode.

10. A light sensing panel, comprising:
the light sensing device of claim 1;
a scan line over the substrate, wherein the gate electrode of the light sensing device is electrically connected to the scan line, and the first drain/source electrode of the light sensing device is electrically connected to the scan line; and
a low potential line over the substrate, wherein the second source/drain electrode of the light sensing device is electrically connected to the low potential line.

11. The light sensing panel of claim 10, wherein the shielding electrode is electrically connected to the low potential line.

12. The light sensing panel of claim 10, further comprising:
at least one data line over the substrate;
a display switch device, wherein a control terminal of the display switch device is connected to the scan line; and
a pixel electrode, wherein two terminals of the display switch device are respectively connected to the data line and the pixel electrode.

* * * * *